(12) United States Patent
Basker et al.

(10) Patent No.: US 9,666,533 B1
(45) Date of Patent: May 30, 2017

(54) AIRGAP FORMATION BETWEEN SOURCE/DRAIN CONTACTS AND GATES

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/198,644

(22) Filed: Jun. 30, 2016

(51) Int. Cl.
| H01L 23/532 | (2006.01) |
| H01L 21/768 | (2006.01) |
| H01L 23/535 | (2006.01) |
| H01L 29/66 | (2006.01) |
| H01L 29/78 | (2006.01) |

(52) U.S. Cl.
CPC .... *H01L 23/5329* (2013.01); *H01L 21/76897* (2013.01); *H01L 23/535* (2013.01); *H01L 29/665* (2013.01); *H01L 29/78* (2013.01)

(58) Field of Classification Search
CPC combination set(s) only.
See application file for complete search history.

(56) References Cited

U.S. PATENT DOCUMENTS

| 5,736,446 | A | 4/1998 | Wu |
| 7,691,712 | B2 | 4/2010 | Chidambarrao et al. |
| 7,741,663 | B2 | 6/2010 | Hause et al. |
| 7,871,923 | B2* | 1/2011 | Liu .............. H01L 21/76807 438/622 |
| 8,390,079 | B2 | 3/2013 | Horak et al. |
| 8,471,343 | B2 | 6/2013 | Doris et al. |
| 8,847,401 | B2 | 9/2014 | Chen et al. |
| 8,871,624 | B2 | 10/2014 | Horak et al. |
| 8,962,474 | B2 | 2/2015 | Yu et al. |
| 9,368,572 | B1* | 6/2016 | Cheng ............... H01L 29/7827 |
| 9,536,982 | B1* | 1/2017 | Cheng ............... H01L 29/6656 |
| 2011/0309416 | A1* | 12/2011 | Yamashita ........... H01L 21/764 257/288 |
| 2012/0199886 | A1 | 8/2012 | Horak et al. |
| 2012/0205810 | A1* | 8/2012 | Kim ................ H01L 27/10888 257/773 |
| 2013/0328199 | A1 | 12/2013 | Yun et al. |

(Continued)

*Primary Examiner* — Mamadou Diallo
(74) *Attorney, Agent, or Firm* — Scully, Scott, Murphy & Presser, P.C.; Jennifer R. Davis, Esq.

(57) ABSTRACT

After forming a source/drain contact including a source/drain contact liner and a source/drain contact conductor surrounded by the source/drain contact liner to contact one of source/drain regions formed on opposite sides of a functional gate structure, vertical portions of the source/drain contact liner are recessed partially or completely to provide a cavity between the functional gate structure and the source/drain contact conductor. An etch resistant layer is deposited over the functional gate structure, each source/drain contact and each cavity to pinch off each cavity, thus forming an airgap between the functional gate structure and each source/drain contact.

20 Claims, 7 Drawing Sheets

(56) References Cited

U.S. PATENT DOCUMENTS

| | | | |
|---|---|---|---|
| 2014/0117420 A1* | 5/2014 | Chen | H01L 23/5222 |
| | | | 257/288 |
| 2015/0228754 A1 | 8/2015 | Sung | |
| 2015/0243544 A1 | 8/2015 | Alptekin et al. | |
| 2015/0263122 A1 | 9/2015 | Hsiao et al. | |

* cited by examiner

AIRGAP FORMATION BETWEEN SOURCE/DRAIN CONTACTS AND GATES

BACKGROUND

The present application relates to semiconductor device fabrication, and more particularly, to a method for reducing parasitic capacitance between the gate electrode and source/drain contacts.

One of the major challenges for field effect transistor (FET) scaling is the increased parasitic capacitance that transistor components exhibit when reduced to smaller scales. As one example, as the feature sizes of transistors continue to shrink, the parasitic capacitance between the source/drain contacts and the gate electrode increases. The result is a degradation in the overall performance of the scaled down device. Therefore, there remains a need to provide FETs having lower parasitic capacitance between the gate electrode and source/drain contacts.

SUMMARY

The present application provides a method for reducing parasitic capacitance between the gate electrode and source/drain contacts. After forming a source/drain contact including a source/drain contact liner and a source/drain contact conductor surrounded by the source/drain contact liner to contact one of source/drain regions formed on opposite sides of a functional gate structure, vertical portions of the source/drain contact liner are recessed partially or completely to provide a cavity between the functional gate structure and the source/drain contact conductor. An etch resistant layer is deposited over the functional gate structure, each source/drain contact and each cavity to pinch off each cavity, thus forming an airgap between the functional gate structure and each source/drain contact. The airgap reduces parasitic capacitance between the functional gate structure and the source/drain contacts.

In one aspect of the present application, a semiconductor structure is provided. The semiconductor structure includes a functional gate structure located over a channel region of a semiconductor material portion and laterally surrounded by an interlevel dielectric (ILD) layer, source/drain regions located on opposite sides of the functional gate structure, and source/drain contacts embedded within the ILD layer and contacting the source/drain regions. Each of the source/drain contacts includes a source/drain contact liner portion and a source/drain contact conductor overlying the source/drain contact liner. The semiconductor structure further includes an airgap located between the functional gate structure and the source/drain contact conductor of each of the source/drain contacts and an etch resistant plug laterally surrounding an upper portion of the source/drain contact conductor of each of the source/drain contacts and capping each airgap.

In another aspect of the present application, a method of forming a semiconductor structure is provided. The method includes forming source/drain regions on opposite sides of a functional gate structure located over a channel region of a semiconductor material portion. Source/drain contacts are then formed embedded in an interlevel dielectric (ILD) layer that laterally surrounds the functional gate structure and contacting the source/drain regions. Each of the source/drain contacts includes a source/drain contact liner and a source/drain contact conductor surrounded by the source/drain contact liner. After recessing vertical portions of the source/drain contact liner of each of the source/drain contacts to provide a cavity between the functional gate structure and the source/drain contact conductor of each of the source/drain contacts, an etch resistant layer is formed over the functional gate structure, the source/drain contacts and the ILD layer. The etch resistant layer pinches off each cavity to form an airgap between the functional gate structure and the source/drain contact conductor of each of the source/drain contacts.

DETAILED DESCRIPTION

Figure 1:
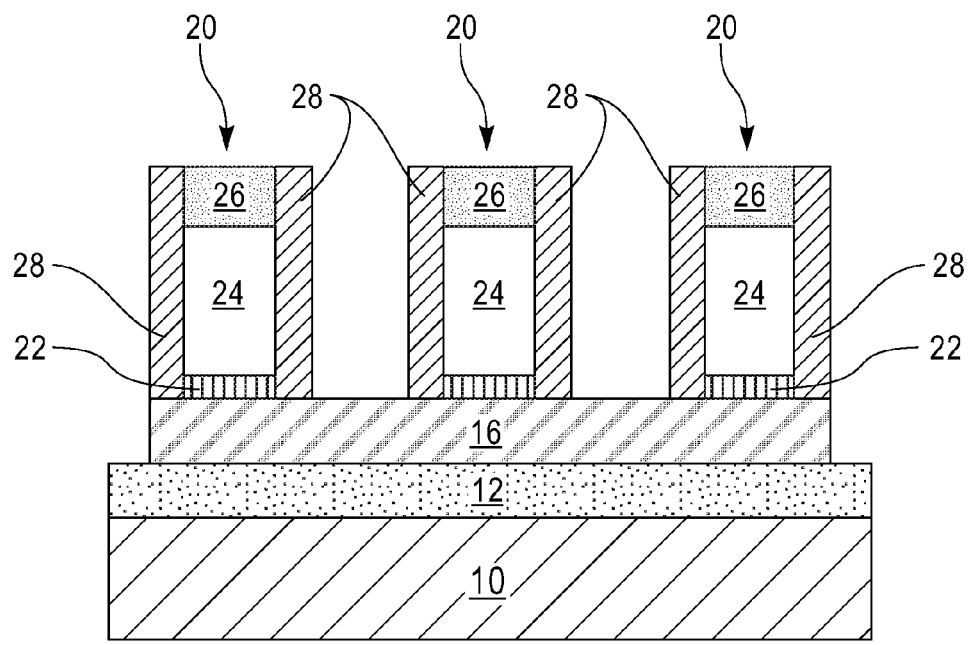
FIG. 1 is a cross-sectional view of an exemplary semiconductor structure including sacrificial gate structures formed over a semiconductor material portion located on a substrate in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, an exemplary semiconductor structure according to an embodiment of the present application includes sacrificial gate structures 20 formed over a semiconductor material portion 16. In one embodiment, the semiconductor material portion 16 can be a semiconductor fin. As used herein, a "fin" is a structure that has a first pair of sidewalls along a lengthwise direction that is longer than a second pair of sidewalls along a widthwise direction. In another embodiment, the semiconductor material portion 16 may represent a semiconductor active device region of a planar semiconductor substrate. In such an embodiment, each semiconductor active device region is separated by a trench isolation structure (not shown) as is well known to those skilled in the art. Although a single semiconductor material portion 16 is described and illustrated, it should be understood that a plurality of semiconductor material portions can be formed in the present application.

In one embodiment, the semiconductor material portion 16 can be formed from a bulk substrate including a bulk semiconductor material throughout (not shown). In another embodiment and as shown in FIG. 1, the semiconductor material portion 16 may be provided from a semiconductor-on-insulator (SOI) substrate. The SOI substrate typically includes, from bottom to top, a handle substrate 10, a buried insulator layer 12 and a top semiconductor layer (not shown) from which the semiconductor material portion 16 is formed.

The handle substrate may 10 include a semiconductor material such as, for example, Si, Ge, SiGe, SiC, SiGeC, a III-V compound semiconductor, a II-VI compound semiconductor or any combinations thereof. The handle substrate 10 provides mechanical support to the buried insulator layer 12 and the top semiconductor layer. The thickness of the handle substrate 10 can be from 30 μm to about 2 mm, although lesser and greater thicknesses can also be employed.

The buried insulator layer 12 may include a dielectric material such as silicon dioxide, silicon nitride, silicon oxynitride, boron nitride or a combination thereof. In one embodiment, the buried insulator layer 12 may be formed by a deposition process, such as chemical vapor deposition (CVD), plasma enhanced chemical vapor deposition (PECVD) or physical vapor deposition (PVD). In another embodiment, the buried insulator layer 12 may be formed using a thermal growth process, such as thermal oxidation, to convert a surface portion of the handle substrate 10 into the buried insulator layer 12. In yet another embodiment, the buried insulator layer 12 can also be formed by implanting oxygen atoms into the handle substrate 10 and thereafter annealing the structure. The thickness of the buried insulator layer 12 can be from 50 nm to 200 nm, although lesser or greater thicknesses can also be employed.

The top semiconductor layer from which the semiconductor material portion 16 is derived may include any semiconductor material as mentioned above for the handle substrate 10. Exemplary semiconductor materials that can be employed as the top semiconductor layer include, but are not limited to, Si, Ge, SiGe, SiC and SiGeC, and III/V compound semiconductors such as, for example, InAs, GaAs, and InP. The semiconductor materials of the top semiconductor layer and the handle substrate 10 may be the same or different. Typically, each of the handle substrate 10 and the top semiconductor layer comprises a single crystalline semiconductor material, such as, for example, single crystalline silicon. The top semiconductor layer can be formed by a deposition process, such as CVD or PECVD. The top semiconductor layer that is formed may have a thickness from 10 nm to 200 nm, although lesser or greater thicknesses can also be employed. Alternatively, the top semiconductor layer may be formed using a smart cut process where two semiconductor wafers are bonded together with an insulator layer in between.

In some embodiments of the present application, a hard mask layer (not shown) can be formed on the top semiconductor layer prior to forming the semiconductor material portion 16. When employed, the hard mask layer may comprise an oxide, nitride, oxynitride or any combination thereof including multilayers. In one embodiment, the hard mask layer includes silicon dioxide or silicon nitride. The hard mask layer can be formed utilizing a conventional deposition process such as, for example, CVD or PECVD. Alternatively, the hard mask layer can be formed by a thermal process such as, for example, oxidation or nitridation of the top semiconductor layer. Any combination of the above mentioned processes can also be used in forming the hard mask layer. The hard mask layer that is formed can have a thickness from 20 nm to 80 nm, although lesser or greater thicknesses can also be employed.

In one embodiment, the semiconductor material portion 16 can be formed by lithography and etching. The lithographic step includes applying a photoresist layer (not shown) atop the top semiconductor layer (or the hard mask, if present), exposing the photoresist layer to a desired pattern of radiation, and developing the exposed photoresist layer utilizing a conventional resist developer. The etching process comprises a dry etch such as, for example, reactive ion etch (RIE) and/or a wet etch. The etching process transfers the pattern from the patterned photoresist layer to the top semiconductor layer or first to the hard mask layer, if present, and thereafter to the underlying top semiconductor layer utilizing the buried insulator layer 12 as an etch stop. After transferring the pattern into the top semiconductor layer, the patterned photoresist layer can be removed utilizing a conventional resist stripping process such as, for example, ashing. Alternatively, the semiconductor material portion 16 can also be formed utilizing a sidewall image transfer (SIT) process. In a typical SIT process, spacers are formed on sidewalls of a sacrificial mandrel. The sacrificial mandrel is removed and the remaining spacers are used as a etch mask to etch the top semiconductor layer. The spacers are then removed after the semiconductor material portions have been formed. The semiconductor material portion 16 can also be formed utilizing a direct self-assembly patterning process.

The semiconductor material portion 16 can have a rectangular horizontal cross-sectional area. The width of the semiconductor material portion 16 can be from 5 nm to 100 nm, although lesser and greater widths can also be employed. The height of the semiconductor material portion 16 can be from 10 nm to 200 nm, although lesser and greater heights can also be employed.

In some embodiments of the present application and when the hard mask layer is present, the hard mask layer that remains atop the semiconductor material portion 16 can be removed at this stage. The removal of the remaining non-etched portion of hard mask layer can be achieved by performing a selective etching process or by utilizing a planarization process such as chemical mechanical planarization (CMP).

The sacrificial gate structures 20 are arranged in parallel with respect to one another. Each sacrificial gate structure 20 includes a sacrificial gate stack and a gate spacer 28 formed on sidewalls of the gate stack. The sacrificial gate stack may include, from bottom to top, a sacrificial gate dielectric 22, a sacrificial gate conductor 24 and a sacrificial gate cap 26. In some embodiments of the present application, the sacrificial gate dielectric 22 and/or the sacrificial gate cap 26 can be omitted.

The sacrificial gate stack (22, 24, 26) can be formed by first providing a material stack (not shown) that includes, from bottom to top, a sacrificial gate dielectric layer, a sacrificial gate conductor layer and a sacrificial gate cap layer over the semiconductor material portion 16. In some embodiments of the present application and as mentioned above, the sacrificial gate dielectric layer can be omitted. When present, the sacrificial gate dielectric layer includes a dielectric material such as an oxide or a nitride. In one embodiment, the sacrificial gate dielectric layer can be a layer of silicon oxide, silicon nitride, or silicon oxynitride. The sacrificial gate dielectric layer can be formed by a conventional deposition process, including but not limited to, CVD or PVD. The sacrificial gate dielectric layer can also be formed by conversion of a surface portion of the semiconductor material portion 16. The conversion may include a thermal oxidation and/or a thermal nitridation process. The sacrificial gate dielectric layer that is formed may have a thickness from 1 nm to 10 nm, although lesser and greater thicknesses can also be employed.

The sacrificial gate conductor layer can include a semiconductor material such as polysilicon or a silicon-containing semiconductor alloy such as a silicon-germanium alloy. The sacrificial gate conductor layer may also include a metal. The sacrificial gate conductor layer can be formed using CVD or PECVD. The sacrificial gate conductor layer that is formed may have a thickness from 20 nm to 300 nm, although lesser and greater thicknesses can also be employed.

The sacrificial gate cap layer may include a dielectric material such as an oxide, a nitride or an oxynitride. In one embodiment, the sacrificial gate cap layer is comprised of silicon nitride. The sacrificial gate cap layer can be formed utilizing a conventional deposition process including, for example, CVD and PECVD. The sacrificial gate cap layer that is formed may have a thickness from 10 nm to 200 nm, although lesser and greater thicknesses can also be employed.

The material stack can then be patterned by lithography and etching to form the sacrificial gate stacks (22, 24, 26). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as, for example, RIE. The remaining portions of the material stack after the pattern transfer constitute the sacrificial gate stacks (22, 24, 26). The remaining portions of the photoresist layer may be subsequently removed by, for example, ashing.

The gate spacers 28 may include a dielectric material such as, for example, an oxide, a nitride, an oxynitride, or any combination thereof. In one embodiment, each gate spacer 28 is composed of silicon nitride. The gate spacers 28 can be formed by first providing a conformal gate spacer material layer (not shown) on exposed surfaces of the sacrificial gate stacks (22, 24, 26), the semiconductor material portion 16 and buried insulator layer 12 and then etching the gate spacer material layer to remove horizontal portions of the gate spacer material layer. The gate spacer material layer can be provided by a deposition process including, for example, CVD, PECVD or atomic layer deposition (ALD). The etching of the gate spacer material layer may be performed by a dry etch process such as, for example, RIE. The remaining portions of the gate spacer material layer constitute the gate spacers 28. The width of each gate spacer 28, as measured at the base of the gate spacer 28 can be from 5 nm to 100 nm, although lesser and greater widths can also be employed.

In some embodiments and when the semiconductor material portion 16 is a semiconductor fin, the sacrificial gate structure 20 may straddle over a portion of the semiconductor fin such that a first portion of the sacrificial gate structure 20 is located on one side of the semiconductor fin and a second portion of the sacrificial gate structure 20 would be located on a second side of the semiconductor fin; a portion of the sacrificial gate structure 20 would sit atop the semiconductor fin.

Figure 2:
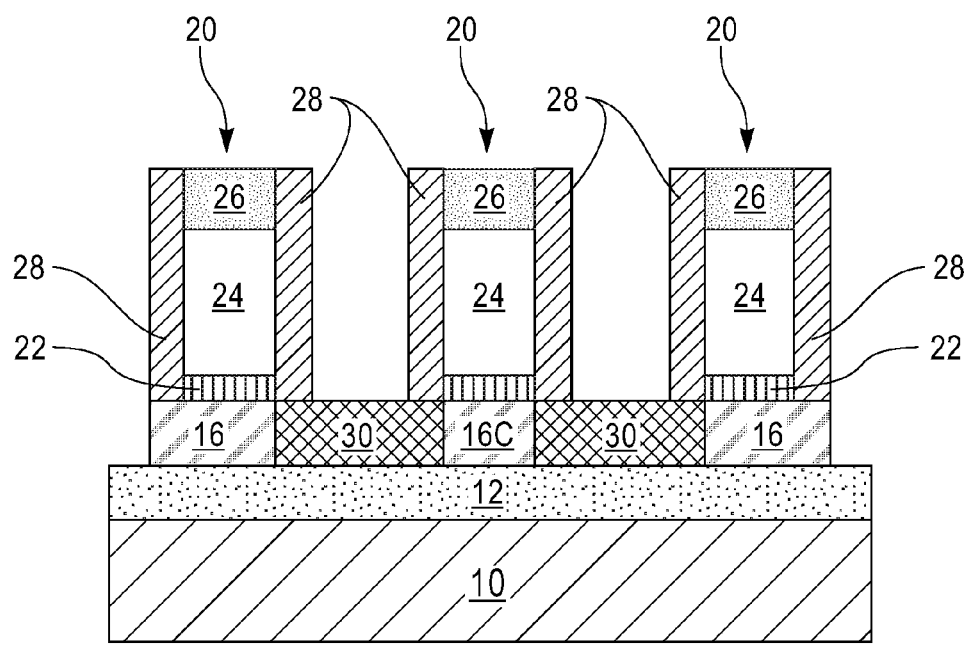
FIG. 2 is a cross-sectional view of the exemplary semiconductor structure of FIG. 1 after forming source/drain regions on opposite sides of each sacrificial gate structure.

Referring to FIG. 2, a source region and a drain region (collectively referred to as source/drain regions 30) are formed on opposite sides of each sacrificial gate structure 20. As used herein, a "source/drain" region can be a source region or a drain region depending on subsequent wiring and application of voltages during operation of a FET. The source/drain regions 30 can be formed by implanting dopants into portions of the semiconductor material portion 16 that are not covered by the sacrificial gate stacks (22, 24, 26). The sacrificial gate stacks (22, 24, 26) are employed as an implantation mask during the ion implantation that forms the source/drain regions 30. An undoped portion of the semiconductor material portion 16 that is laterally surrounded by the source/drain regions 30 constitutes a channel region 16C for a FET. For n-type FETs, the source/drain regions 30 can be formed by implanting an n-type dopant, while for p-type FETs, the source/drain regions 30 can be formed by implanting a p-type dopant. Exemplary n-type dopants include, but are not limited to, P, As or Sb. Exemplary p-type dopants include, but are not limited to, B, Al, Ga or In. An activation anneal can be subsequently performed to activate the implanted dopants in the source/drain regions 30.

Optionally, a selective epitaxial process can be performed to deposit a semiconductor material on physically exposed semiconductor surfaces including top and sidewall surfaces of the source/drain regions 30, thus forming raised source/drain regions (not shown) on the source/drain regions 30. Each of the raised source/drain regions is epitaxially aligned to an underlying source/drain region 30. By "epitaxially aligned" it is meant that each of the raised source/drain regions has the same crystalline orientation as that of the underlying source/drain region 30.

The semiconductor material that provides the raised source/drain regions can include Si, Ge, SiGe, SiP or SiC. In one embodiment, the raised source/drain regions are composed of SiGe for formation of p-type FETs. In another embodiment, the raised source/drain regions are composed of SiP for formation of n-type FETs.

The semiconductor material that provides the raised source/drain regions can be deposited as an intrinsic semiconductor material, or can be deposited with in-situ doping. If the semiconductor material is deposited as an intrinsic semiconductor material, the raised source/drain regions can be subsequently doped (ex-situ) utilizing ion implantation, gas phase doping or dopant out diffusion from a sacrificial dopant source material.

Figure 3:
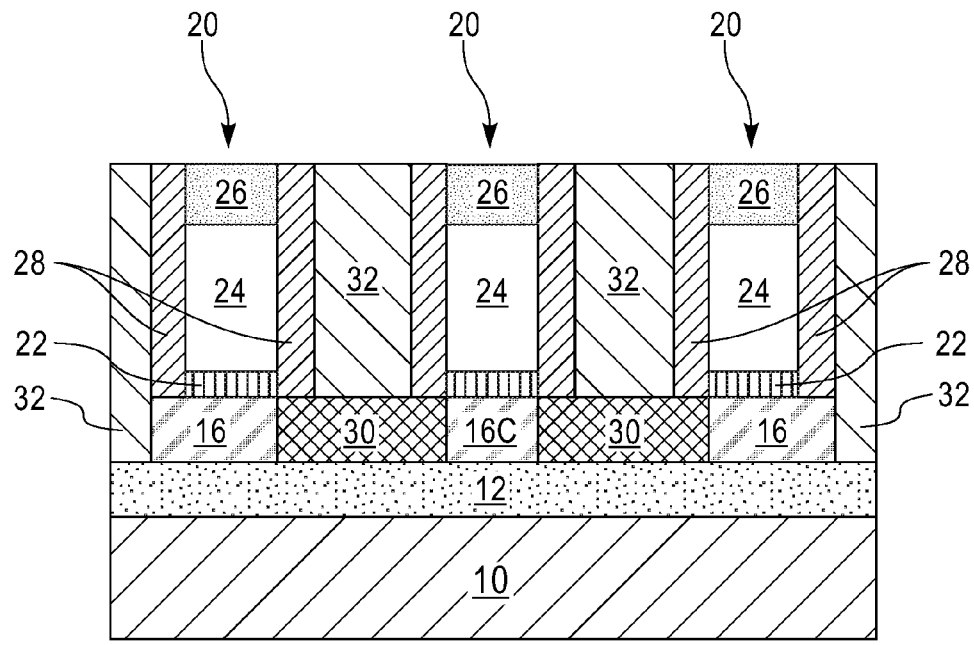
FIG. 3 is a cross-sectional view of the exemplary semiconductor structure of FIG. 2 after forming an interlevel dielectric (ILD) layer over the source/drain regions and the substrate to laterally surround the sacrificial gate structures.

Referring to FIG. 3, an interlevel dielectric (ILD) layer 32 is formed over the source/drain regions 30 or the raised source/drain regions, if present, and the buried insulator layer 12. The ILD Layer 32 laterally surrounds the sacrificial gate structures 20. In some embodiments of the present application, the ILD layer 32 is composed of a dielectric material that may be easily planarized. For example, the ILD layer 40 can include a doped silicate glass, an undoped silicate glass (silicon oxide), an organosilicate glass (OSG), a porous dielectric material, or amorphous carbon. The ILD layer 32 can be deposited using a conventional deposition process such as, for example, CVD, PECVD or spin coating. If the ILD layer 32 is not self-planarizing, and following the deposition of the ILD layer 32, the ILD layer 32 can be subsequently planarized, for example, by CMP using the topmost surfaces of the sacrificial gate structures 20 (i.e., the top surfaces of the sacrificial gate caps 26) as an etch stop so that a top surface of the ILD layer 32 is coplanar with the top surfaces of the sacrificial gate caps 26.

Figure 4:
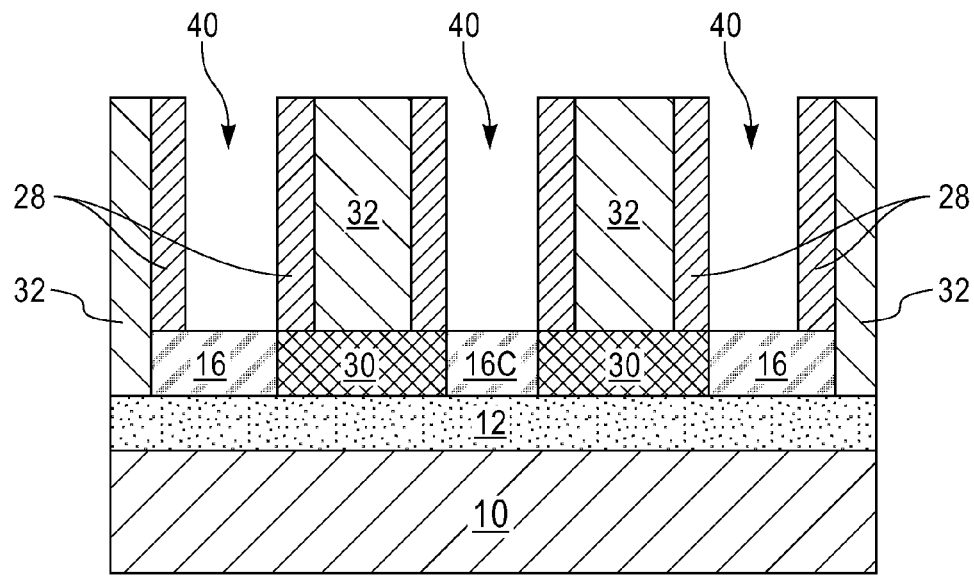
FIG. 4 is a cross-sectional view of the exemplary semiconductor structure of FIG. 3 after removing a sacrificial gate stack within each of the sacrificial gate structures to form gate cavities.

Referring to FIG. 4, the sacrificial gate stack (22, 24, 26) of each sacrificial gate structure 20 are removed; the gate spacers 28 remain. The sacrificial gate stacks (22, 24, 26) can be removed selectively to the semiconductor material portion 16, the gate spacers 28 and the ILD layer 32 using at least one etch. The at least on etch can be a wet etch such as an ammonia etch or a dry etch such as RIE. A gate cavity 40 is thus formed within a volume from which each sacrificial gate stacks (22, 24, 26) is removed and is laterally confined by inner sidewalls of the gate spacer 28.

Figure 5:
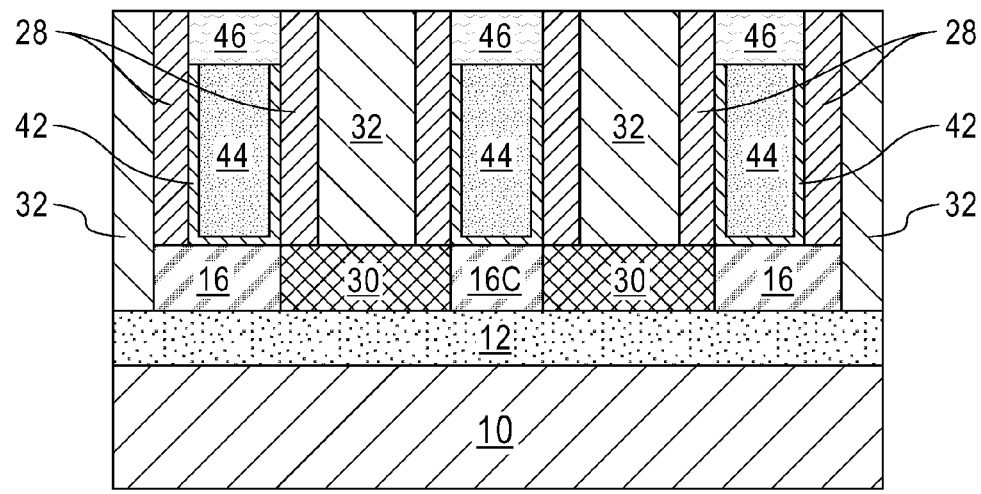
FIG. 5 is a cross-sectional view of the exemplary semiconductor structure of FIG. 4 after forming functional gate stacks in the gate cavities to provide functional gate structures.

Referring to FIG. 5, functional gate stacks are formed in the gate cavities 40 and are laterally surrounded by the gate spacers 28. Each functional gate stack includes, from bottom to top, a gate dielectric 42, a gate electrode 44 and a gate cap 46; in some embodiments gate cap 46 may be omitted. Each functional gate stack (42, 44, 46) and the gate spacer 28 present on opposite sidewalls of each functional gate stack constitute a functional gate structure. By "functional gate structure" it is meant a permanent gate structure used to control output current (i.e., flow of carriers in the channel) of a semiconducting device through electrical or magnetic fields.

The functional gate stacks (42, 44, 46) can be formed by first depositing a conformal gate dielectric layer (not shown) on a bottom surface and sidewalls of each of the gate cavities 40 and on the top surface of the ILD layer 32. The gate dielectric layer can be a high dielectric constant (high-k) material layer having a dielectric constant greater than 8.0. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In one embodiment, the gate dielectric layer includes $HfO_2$. The gate dielectric layer can be formed by a conventional deposition process including, but not limited to, CVD, PVD, ALD, molecular beam epitaxy (MBE), ion beam deposition, electron beam deposition, and laser assisted deposition. The gate dielectric layer that is formed may have a thickness ranging from 0.9 nm to 6 nm, although lesser and greater thicknesses can also be employed. The gate dielectric layer may have an effective oxide thickness on the order of or less than 1 nm.

Remaining volumes of the gate cavities 40 are then filled with a gate electrode layer (not shown). The gate electrode layer can include a conductive metal, such as, for example, tungsten, titanium, tantalum, aluminum, nickel, ruthenium, palladium and platinum. In one embodiment, the gate electrode layer is comprised of tungsten. The gate electrode layer can be formed utilizing a conventional deposition process including, for example, CVD, PECVD, PVD, sputtering and ALD.

In some embodiment of the present application, prior to the formation of the gate electrode layer, a work function metal layer (not shown) may be conformally deposited over the gate dielectric layer employing CVD, ALD, sputtering or plating. The work function metal layer includes a metal having a work function suitable to tune the work function of FETs subsequently formed. The thickness of the work function metal layer can be from 2 nm to 15 nm, although lesser and greater thicknesses can also be employed.

The portions of the gate electrode layer and the gate dielectric layer formed above the top surface of the ILD layer 32 can be removed, for example, by CMP. In some embodiments and as illustrated, the remaining portions of the gate electrode layer and the remaining portions of the gate dielectric layer may be recessed utilizing a dry etch or a wet etch to provide a void (not shown) in each of the gate cavities 40. Each recessed portion of the gate dielectric layer within each gate cavity constitutes a gate dielectric 42, and each recessed portion of the gate electrode layer within each gate cavity 40 constitutes a gate electrode 44.

A gate cap material is then deposited over the gate dielectric 42 and the gate electrode 44 in each gate cavity 40 and planarized to fill voids that are formed after recessing the remaining portions of the gate electrode layer and the remaining portions of the gate dielectric layer. Exemplary gate cap materials include, but are not limited to, silicon nitride, silicon carbide nitride (SiCN), or silicon boron carbonitride (SiBCN). The deposition of the gate cap material can be performed utilizing a conventional deposition process such as, for example, CVD or PECVD. Following the deposition of the gate cap material, the deposited gate cap material can be subsequently planarized, for example, by CMP using the top surface of the ILD layer 32 as a polish stop to provide the gate caps 46. In the illustrated embodiment of the present application, the top surface of each of the gate caps 46 thus formed is coplanar with the top surface of the ILD layer 32.

Figure 6:
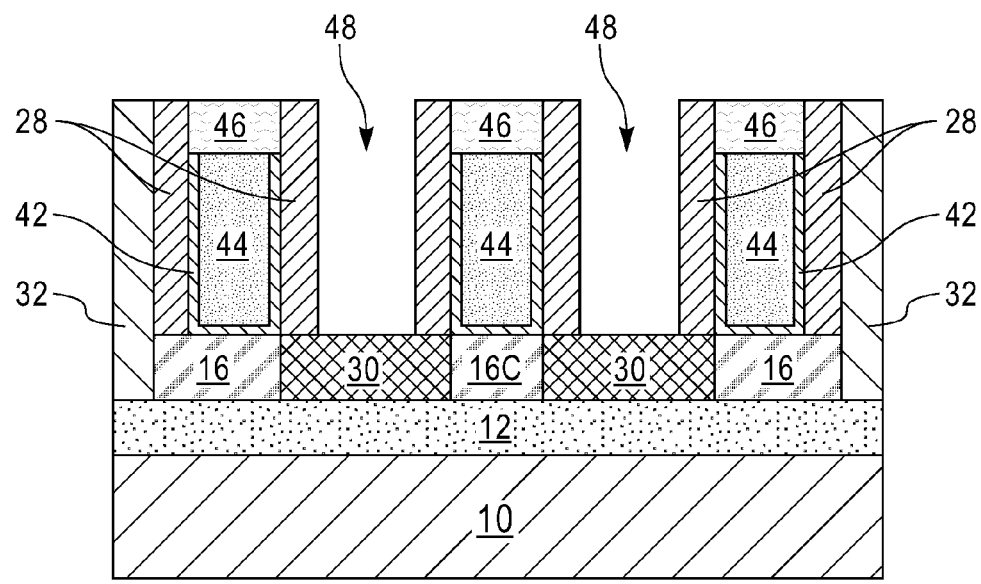
FIG. 6 is a cross-sectional view of the exemplary semiconductor structure of FIG. 5 after form source/drain contact openings extending through the ILD layer to expose source/drain regions.

Referring to FIG. 6, portions of the ILD layer 32 located between neighboring functional gate structures (42, 44, 46, 28) are removed to provide source/drain contact openings 48, exposing the source/drain regions 30. In one embodiment and as shown in FIG. 6, entire portions of the ILD layer 32 that are located between the neighboring functional gate structure (42, 44, 46, 28) are removed such that the source/drain contacts opening 48 are laterally confined by outer sidewalls of the neighboring gate spacers 28. In another embodiment, only portions of the ILD layer 32 that are located between the neighboring functional gate structure (42, 44, 46, 28) are removed such that the source/drain contacts opening 48 are laterally confined by a remaining portion of the ILD layer 32 (not shown). The source/drain contact openings 48 can be formed by applying a mask layer (not shown) over the ILD layer 32 and the functional gate structures (42, 44, 46, 28), and then lithographically patterning the mask layer to form openings therein. Each opening overlies a portion of one of the source/drain regions 30 and in some embodiments, a portion of each gate spacer 28. The mask layer can be a photoresist layer or a photoresist layer in conjunction with hardmask layer(s). The pattern in the mask layer is transferred through the ILD layer 32 to form the source/drain contact openings 48. In one embodiment of the present application, a RIE may be performed to remove the exposed portions of the ILD layer 32 to expose source/drain regions 30. After forming the source/drain contact openings 48, the remaining mask layer can be removed by oxygen-based or $N_2/H_2$-based plasma etching.

Figure 7:
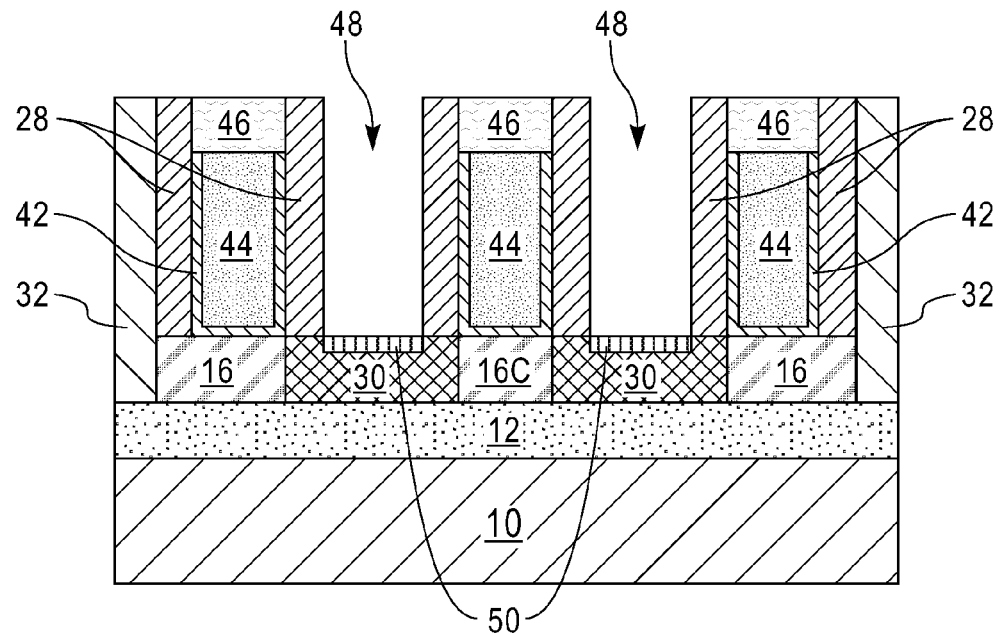
FIG. 7 is a cross-sectional view of the exemplary semiconductor structure of FIG. 6 after forming metal semiconductor alloy regions at a bottom of each of the source/drain contact openings.

Referring to FIG. 7, a metal semiconductor alloy region 50 is formed at a bottom of each source/drain contact opening 48. The metal semiconductor alloy regions 50 may be composed of a silicide or germicide. In one embodiment, the metal semiconductor alloy regions 50 can be formed by first depositing a metal layer along sidewalls and the bottom of each of the source/drain contact openings 48 and over the top surfaces of ILD layer 32 and functional gate structures (42, 44, 46, 28). The metal layer may include a metal such as Ni, Co, Pt, W, Ti, Ta, a rare earth metal (e.g., Er, Yt, La), an alloy thereof, or any combination thereof. The metal layer may be deposited by CVD, PVD or ALD. The thickness of the metal layer can be from 2 nm to 10 nm, although lesser and greater thicknesses can also be employed. A diffusion barrier such as, for example, TiN or TaN, may be formed over the metal layer.

An anneal is subsequently performed at an elevated temperature to induce reaction of the semiconductor material of the source/drain regions 30 exposed at the bottom of the source/drain contact openings 48 and the metal in the metal layer to provide the metal semiconductor alloy regions 50. The unreacted portion of the metal layer, and, if present, the diffusion barrier, is (are) then removed, for example, by an etch (or etches). In one embodiment, the etch can be a wet etch that removes the metal in the metal layer selective to the metal semiconductor alloy in the metal semiconductor alloy regions 50. The wet etch can be combined with a post-clean that removes any remnants of the metal layer from the outer sidewalls of the gate spacers 28 that are exposed by the source/drain contact openings 48.

Figure 8:
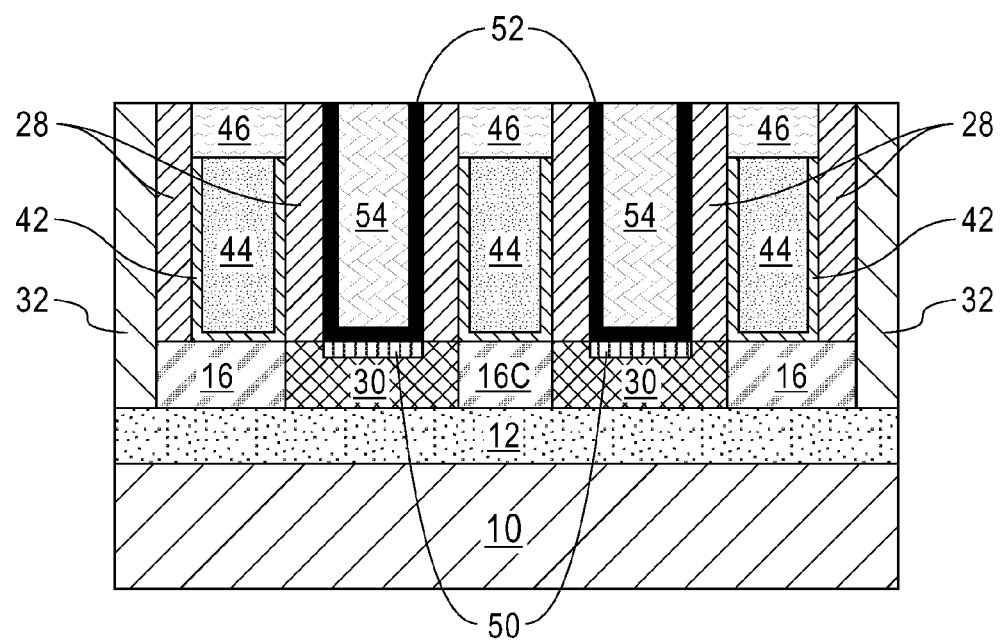
FIG. 8 is a cross-sectional view of the exemplary semiconductor structure of FIG. 7 after forming source/drain contacts within the source/drain contact openings.

Referring to FIG. 8, source/drain contacts are formed in the source/drain contact openings 48. Each source/drain contact includes a source/drain contact liner 52 present along sidewalls and a bottom of each source/drain contact opening 48 and a source/drain contact conductor 54 overlying the source/drain contact liner 52. The source/drain contacts (52, 54) are in direct contact with the metal semiconductor alloy regions 50 located at bottom of the source/drain contact openings 48.

The source/drain contacts (52, 54) can be formed by first depositing a first contact liner layer (not shown) along sidewalls and the bottom of each of the source/drain contact openings 48 and over the top surface of the ILD layer 32. In one embodiment, the first contact liner layer may include a diffusion barrier material that can block and/or absorb fluorine from $WF_6$ deposition employed subsequently for formation of the source/drain contact conductors 54. Exemplary diffusion barrier material include, but are not limited to, Ti, Ta, Ni, Co, Pt, W, Ru, TiN, TaN, WN, WC, an alloy thereof, or a stack thereof such as Ti/TiN and Ti/WC. The first contact liner layer may be formed utilizing a conformal deposition process including CVD or ALD. The first contact liner layer that is formed can have a thickness ranging from 1 nm to 5 nm, although lesser and greater thicknesses can also be employed.

A first contact conductor layer (not shown) is subsequently deposited on the first contact liner layer to completely fill the source/drain contact openings 48. The first contact conductor layer may include a metal such as, for example, W, Cu, Al, Co, Ru, Mo, Os, Jr, Rh or an alloy thereof. The first contact conductor layer can be formed by any suitable deposition method such as, for example, CVD, PVD or plating.

Portions of the first contact conductor layer and the first contact liner layer that are located above the top surface of the ILD layer 32 are removed by employing a planarization process, such as, for example, CMP. Remaining portions of the first contact liner layer located along the sidewalls and bottoms the source/drain contact openings 48 constitute the source/drain contact liners 52, while remaining portions of the first contact conductor layer located within the source/drain contact openings 48 constitute the source/drain contact conductors 54. The top surfaces of the source/drain contact liners 52 and the source/drain contact conductors 54 are coplanar with the top surface of the ILD layer 32.

Figure 9:
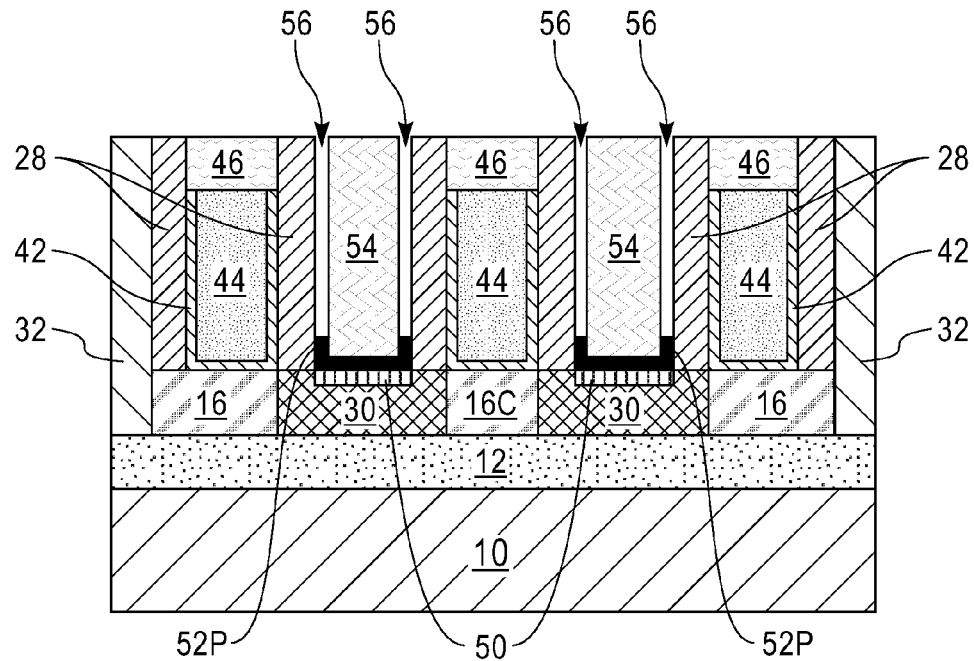
FIG. 9 is a cross-sectional view of the exemplary semiconductor structure of FIG. 8 after recessing vertical portions of source/drain contact liners in the source/drain contacts to provide cavities located between the source/drain contacts and the functional gate structures.

Referring to FIG. 9, vertical portions of the source/drain contact liners 52 are recessed to provide cavities 56 between the source/drain contact conductors 54 and the functional gate structures (42, 44, 46, 28). The recessing of the source/drain contact liners 52 may be performed by an anisotropic etch. The anisotropic etch can be a dry etch or a wet etch that removes the conductive material that provides the source/drain contact liners 52 selective to the conductive material that provides the source/drain contact conductors 54 and the dielectric materials that provide gate spacers 28, the gate caps 46 and the ILD layer 32. In one embodiment and when the source/drain contact conductors 54 are composed of W and the source/drain contact liners 52 are composed of TiN, the source/drain contact liners 52 may be recessed by a wet chemical etch using an alkaline solution (SC-1) including an aqueous mixture of ammonium hydroxide and hydrogen peroxide (e.g., 1:1:5 of 30% $H_2O_2$, 28% $NH_4OH$ and $H_2O$). The vertical portions of the source/drain contact liners 52 can be partially or completely removed. Any remaining portion of the source/drain contact liner 52 within each source/drain contact opening 48 is herein referred to as a source/drain contact liner portion 52P.

In one embodiment and as shown in FIG. 9, when the vertical portions of the source/drain contact liners 52 are partially removed, the cavities 56 thus formed expose sidewalls of upper portions of the source/drain conductors 54. In this case, each source/drain contact liner portion 52P surrounds a lower portion of each source/drain contact conductor 54, thus laterally contacting sidewalls of the lower portion of each source/drain contact conductor 54. In another embodiment, and when the vertical portions of the source/drain contact liners 52 are completely removed, the cavities 56 thus formed expose entire sidewalls of the source/drain conductors 54 (not shown). In this case, an entirety of each source/drain contact liner portion 52P is located beneath each source/drain contact conductor 54 (not shown).

Figure 10:
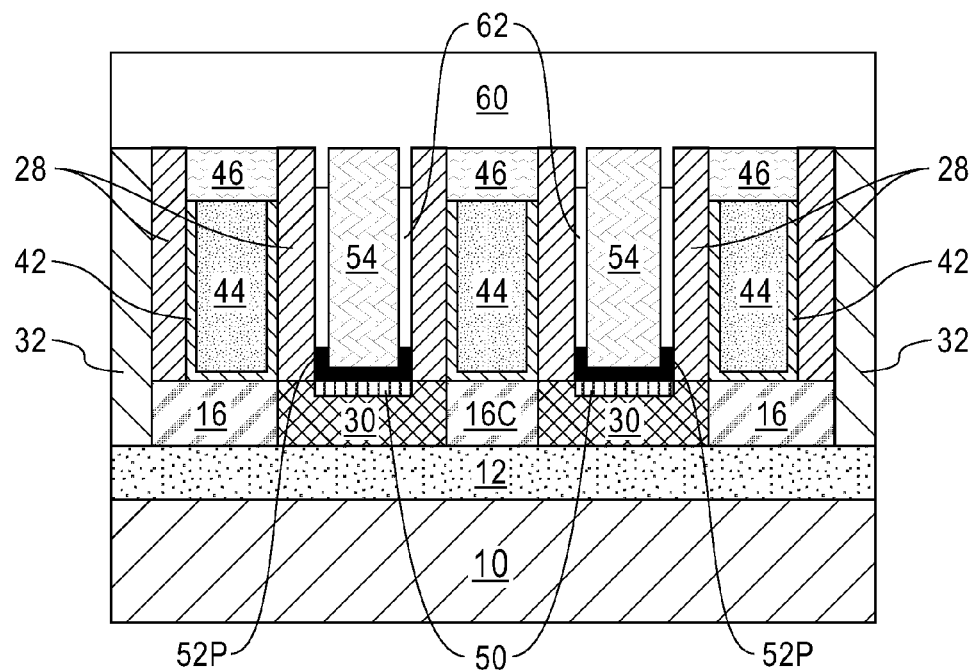
FIG. 10 is a cross-sectional view of the exemplary semiconductor structure of FIG. 9 after forming an etch resistant layer to pinch off the cavities, thus forming airgaps between the source/drain contacts and the functional gate structures.

Referring to FIG. 10, a non-conformal etch resistant layer 60, which can withstand the conditions of subsequent etching process (e.g., RIE) for the subsequent formation of local contacts (e.g., contacts to the functional gate structures and contacts to the source/drain contacts), is deposited over the ILD layer 32, the functional gate structures (42, 44, 46, 28) and the source/drain contact conductors 54 and within the cavities 56. By "non-conformal" it is meant a material having different thicknesses on a vertical and horizontal surface. In one embodiment, the etch resistant layer 60 may be deposited, for example, by PECVD. The non-conformal etch resistant layer 60 pinches off the cavities 56. Airgaps 62 are thus formed between the source/drain contact conductors 54 and the functional gate structures (42, 44, 46, 28) to reduce the parasitic capacitance therebetween. In the present application, since the source/drain contact liners 52 are employed mainly to prevent the fluorine diffusion during the deposition of the source/drain contact conductor layer from which the source/drain contact conductors 54, forming airgaps 62 by removing vertical portions of the source/drain contact liners 52 after formation of the source/drain contact conductor 54 does not affect the contact resistance between the source/drain contacts (52P, 54) and the source/drain regions 30.

The etch resistant layer 60 may include a dielectric material having a higher etch resistance than the dielectric materials that provide the gate spacers 28 and the ILD layer 32 and a dielectric material that provides a contact level dielectric layer subsequently formed. In one embodiment, the etch resistant layer 60 includes a metal oxide such as, for example, $HfO_2$. Alternatively, the etch resistant layer 60 may include a conductive material such as, for example, TiN or TaN. Employing the conductive material in the etch resistant layer 60 can increase the contact area between the source/drain contact (52P, 54) and a subsequently formed local contact overlying each source/drain contact (52P, 54)

Figure 11:
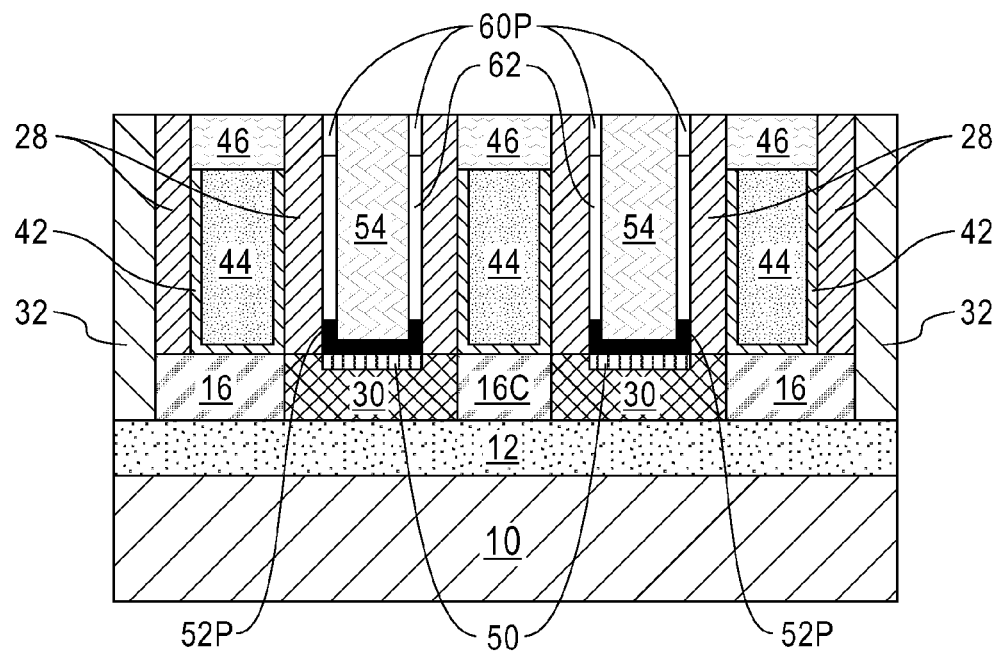
FIG. 11 is a cross-sectional view of the exemplary semiconductor structure of FIG. 10 after forming an etch resistant plug capping each of the airgaps.

Referring to FIG. 11, a portion of the etch resistant layer 60 that is present on the top surface of the ILD layer 32 is removed by a planarization process such as, for example, CMP and/or a recess using the top surface of the ILD layer 32 as a polish or etch stop. In one embodiment and when the etch resistant layer 60 is composed of $HfO_2$, the etch resistant layer 60 may be etched back using $BCl_3$. In another embodiment and when the etch resistant layer 60 is composed of TiN, the etch resistant layer 60 may be etched back using SC-1. Remaining portions of the etch resistant layer 60 located between the source/drain contact conductors 54 and the functional gate structures (42, 44, 46, 28) are herein referred to as etch resistant plugs 60P. The etch resistant plugs 60P overlie the airgaps 62 and have top surfaces coplanar with the top surface of the ILD layer 32.

Figure 12:
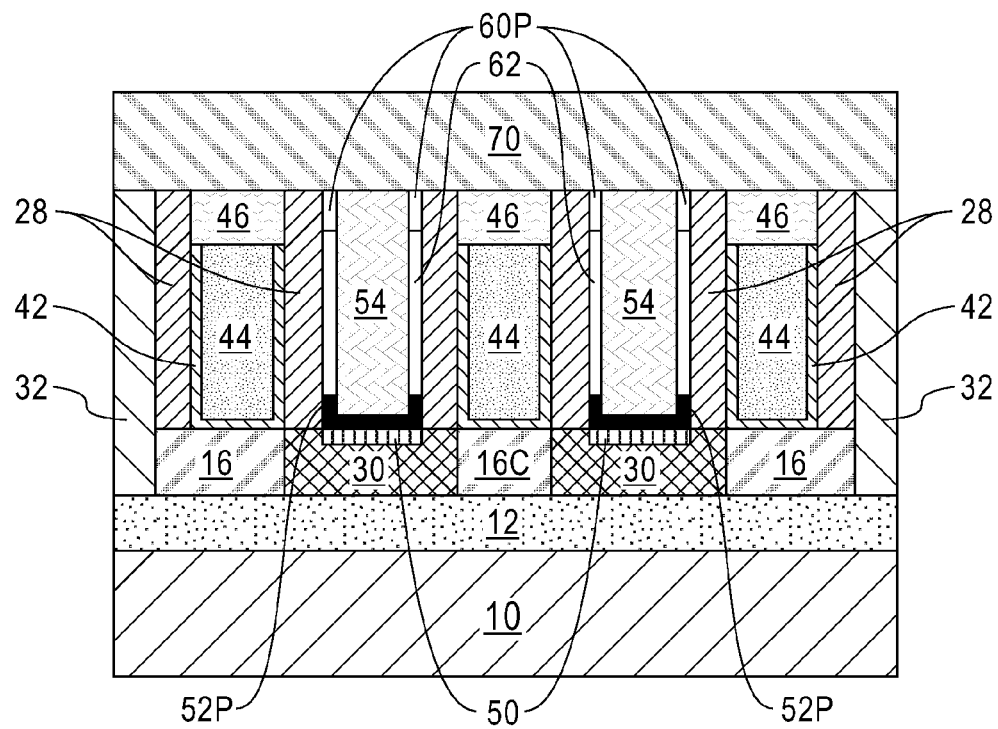
FIG. 12 is a cross-sectional view of the exemplary semiconductor structure of FIG. 11 after forming a contact level dielectric layer over the functional gate structure, the source/drain contacts, the etch resistant plugs and the ILD layer.

Referring to FIG. 12, a contact level dielectric layer 70 is formed over the functional gate structure (42, 44, 46, 28), the source/drain contacts (52P, 54), the etch resist plugs 60P and the ILD layer 32. The contact level dielectric layer 70 may include a dielectric material which may be the same as, or different from, the dielectric material that provides the ILD layer 32. For example, the contact level dielectric layer 70 may include silicon dioxide or silicon nitride. The contact level dielectric layer 70 can be formed, for example, by CVD, PVD or spin-on coating. If the contact level dielectric layer 70 is not self-planarizing, the top surface of the contact level dielectric layer 70 can be planarized, for example, by CMP. The planarized top surface of the contact level dielectric layer 70 is located above the top surface of the ILD layer 32. In one embodiment, the contact level dielectric layer 70 may have a thickness ranging from 20 nm to 200 nm, although lesser and greater thicknesses can also be employed.

Figure 13:
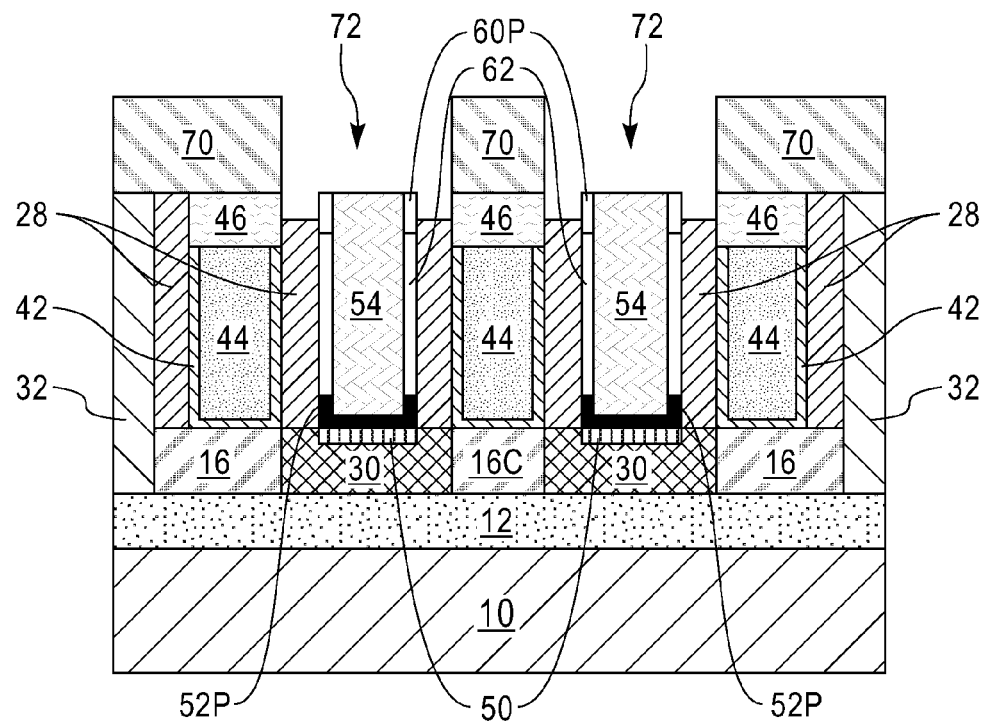
FIG. 13 is a cross-sectional view of the exemplary semiconductor structure of FIG. 12 after forming local contact openings extending through the contact level dielectric layer to expose source/drain contact conductors of the source/drain contacts.

Referring to FIG. 13, local contact openings 72 are formed. Each local contact opening 72 extends through the contact level dielectric layer 70, exposing the source/drain contact conductor 54 within each source/drain contact (52P, 54). The local contact openings 72 can be formed by a combination of lithographic patterning and anisotropic etch. A mask layer (not shown) is formed over the contact level dielectric layer 70, and then lithographically patterned to form openings therein. The openings overlie areas in which formation of the local contact openings 72 are desired. The mask layer can be a photoresist layer or a photoresist layer in conjunction with hard mask layer(s). The pattern in the mask layer is transferred through the contact level dielectric layer 70 by an anisotropic etch to provide the local contact openings 72. The anisotropic etch can be a dry etch or a wet etch that removes the dielectric materials of the contact level dielectric layer 70 selective to the dielectric material of the etch resistant plugs 60P and the conductive material of the source/drain contact conductors 54. After forming the local contact openings 72, the remaining portions of the mask layer can be removed by oxygen-based or $N_2H_2$-based plasma etching.

In one embodiment and as shown in FIG. 13, the etch chemistry that is utilized to pattern the contact level dielectric layer 70 also etches the gate spacers 28, or portions of the ILD layer 32 located between the functional gate structures (42, 44, 46, 28), if present. However, due to the higher etch resistance of the etch resistant plugs 60P, the etch resistant plugs 60 remain intact during the etching process. Thus after formation of the local contact openings 72, the airgaps 62 remain capped by the etch resistant plugs 60P. The robust etch resistant plugs 60 prevent the filling of the airgaps 62 during subsequent processes.

Figure 14:
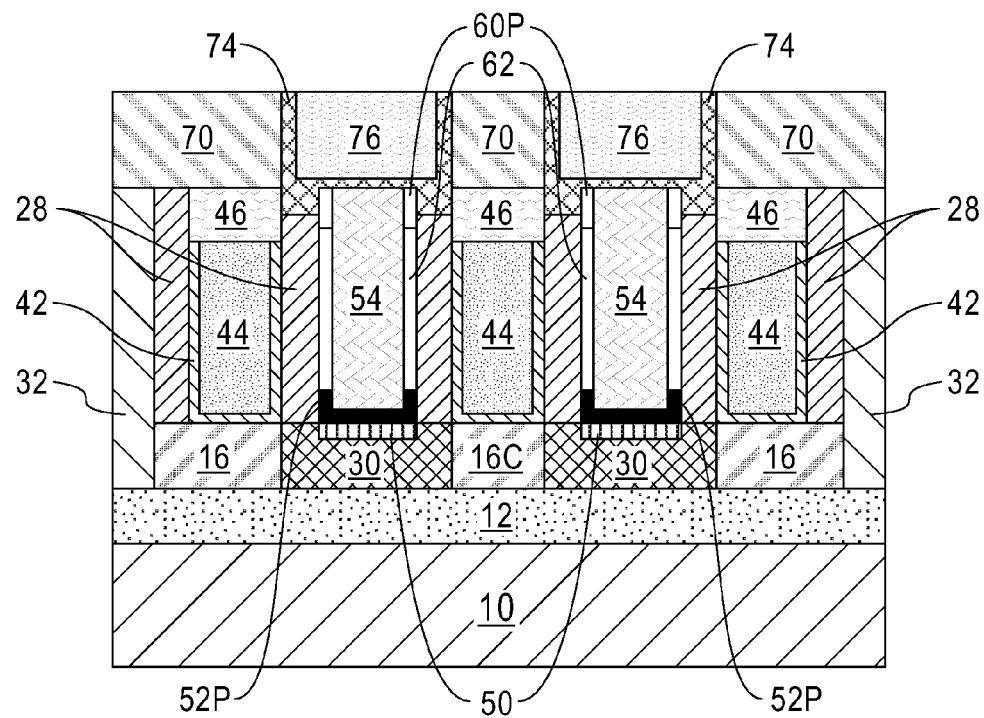
FIG. 14 is a cross-sectional view of the exemplary semiconductor structure of FIG. 13 after forming local contacts within the local contact openings

Referring to FIG. 14, local contacts are formed within the local contact openings 72 to provide electrical connection to the source/drain contacts (52P, 54). Each local contact is in direct contact with the source/drain contact conductor 54 in one of the source/drain contacts (52P, 54). In one embodiment and as shown in FIG. 14, the local contacts laterally surround the etch resistant plugs 60P. Each local contact includes a local contact liner 74 and a local contact conductor 76 surrounded by the local contact liner 74.

The local contacts (74, 76) can be formed by performed processing steps described above in FIG. 6. A second contact liner layer (not shown) is deposited along sidewalls and bottoms of the local contact openings 72 and over the top surface of the contact level dielectric layer 70. The second contact liner layer may include a metal the same as, or different from, the first contact liner layer. For example, the second contact liner layer may include Ti, Ta, Ni, Co, Pt, W, Ru, TiN, TaN, WN, WC, an alloy thereof or a stack thereof such as Ti/TiN and Ti/WC and may be formed by CVD or ALD.

A second contact conductor layer (not shown) is then formed over the second contact liner layer to completely fill the local contact openings 72. The second contact conductor layer may include a metal such as, for example, W, Cu, Al, Co, Ru, Mo, Os, Ir, Rh or an alloy thereof. The conductive material that provides the second contact conductor layer can be the same, or different from, that of the first contact conductor layer. The second contact conductor layer can be formed by, CVD, PVD or plating.

Portions of the second contact conductor layer and the second contact liner layer that are located above the top surface of the contact level dielectric layer 70 are subsequently removed by employing a planarization process such as, for example, CMP. Remaining portions of the second contact conductor layer located within the local contact openings 72 constitute the local contact conductors 76, and remaining portions of the second contact liner layer located along sidewalls and bottoms of the local contact openings 72 constitute the local contact liners 74.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a functional gate structure located over a channel region of a semiconductor material portion and laterally surrounded by an interlevel dielectric (ILD) layer;
    source/drain regions located on opposite sides of the functional gate structure;
    source/drain contacts embedded within the ILD layer and contacting the source/drain regions, wherein each of the source/drain contacts comprises a source/drain contact liner portion and a source/drain contact conductor overlying the source/drain contact liner;
    an airgap located between the functional gate structure and the source/drain contact conductor of each of the source/drain contacts; and
    an etch resistant plug laterally surrounding an upper portion of the source/drain contact conductor of each of the source/drain contacts and capping each airgap.

2. The semiconductor structure of claim 1, wherein the source/drain contact liner portion contacts a bottom surface and sidewalls of a lower portion of the source/drain contact conductor.

3. The semiconductor structure of claim 1, wherein an entirety of the source/drain contact liner portion contacts a bottom surface of the source/drain contact conductor.

4. The semiconductor structure of claim 1, wherein a top surface of each etch resistant plug is coplanar with a top surface of the ILD layer and a top surface of the source/drain contact conductor of each of the source/drain contacts.

5. The semiconductor structure of claim 1, wherein the functional gate structure comprises a stack of a gate dielectric, a gate electrode surrounded by the gate dielectric and a gate cap overlying the gate dielectric and the gate electrode, and a gate spacer present on sidewalls of the functional gate structure.

6. The semiconductor structure of claim 5, further comprising a local contact in contact with a top surface of the source/drain contact conductor of each of the source/drain contacts, a top surface and sidewalls of each etch resistant plug and a recessed surface of the gate spacer, wherein the recessed surface of the gate spacer is located below the top surface of each etch resistant plug.

7. The semiconductor structure of claim 6, wherein each local contact is embedded within a contact level dielectric layer located over the ILD layer.

8. The semiconductor structure of claim 7, wherein each etch resistant plug comprises a dielectric material or a metallic material having an etch resistance higher than a etch resistance of each of the gate space, the ILD layer and the contact level dielectric layer.

9. The semiconductor structure of claim 8, wherein each etch resistant plug comprises $HfO_2$, TiN or TaN.

10. The semiconductor structure of claim 1, further comprising a metal semiconductor alloy region located between each of the source/drain contacts and one of the source/drain regions.

11. The semiconductor structure of claim 10, wherein the metal semiconductor alloy region comprises a metal silicide or a metal germicide.

12. A method of forming a semiconductor structure comprising:
    forming source/drain regions on opposite sides of a functional gate structure located over a channel region of a semiconductor material portion;
    forming source/drain contacts embedded in an interlevel dielectric (ILD) layer that laterally surrounds the functional gate structure and contacting the source/drain regions, each of the source/drain contacts comprising a source/drain contact liner and a source/drain contact conductor surrounded by the source/drain contact liner;
    recessing vertical portions of the source/drain contact liner of each of the source/drain contacts to provide a cavity between the functional gate structure and the source/drain contact conductor of each of the source/drain contacts; and
    forming an etch resistant layer over the functional gate structure, the source/drain contacts and the ILD layer, the etch resistant layer pinching off each cavity to form an airgap between the functional gate structure and the source/drain contact conductor of each of the source/drain contacts.

13. The method of claim 12, further comprising removing a portion of the etch resistant layer that is located above a top surface of the ILD layer to provide an etch resistant plug capping each airgap.

14. The method of claim 13, wherein each etch resistant plug laterally surrounds an upper portion of the source/drain contact conductor of each of the source/drain contacts and has a top surface coplanar with the top surface of the ILD layer.

15. The method of claim 12, wherein during the recessing, the vertical portions of the source/drain contact liner of each of the source/drain contacts are partially recessed, wherein remaining portions of the vertical portions of the source/drain contact liner of each of the source/drain contacts laterally surround sidewalls of a lower portion of the source/drain contact conductor of each of the source/drain contacts.

16. The method of claim 12, wherein during the recessing, the vertical portions of the source/drain contact liner of each of the source/drain contacts are completely recessed, wherein an entirety of an remaining portion of the source/drain contact liner of each of the source/drain contacts is located beneath a bottom surface of the source/drain contact conductor of each of the source/drain contacts.

17. The method of claim 13, further comprising forming a local contact in contact with the source/drain contact conductor of each of the source/drain contacts.

18. The method of claim 17, wherein the forming the source/drain contact comprises:
    forming a contact level dielectric layer over the ILD layer, the functional gate structure, the source/drain contact conductor of each of the source/drain contacts and each etch resistance plug;
    forming local contact openings extending through the contact level dielectric layer, each of the local contact openings exposing the source/drain contact conductor within one of the source/drain contacts; and
    forming a local contact liner along sidewalls and a bottom surface of each of the local contact openings and a local contact conductor overlying the local contact liner and within each of the local contact openings.

19. The method of claim 18, wherein the forming the local contact openings comprising etching the contact level dielectric layer by an anisotropic etch.

20. The method of claim 19, wherein the anisotropic etch recessing portions of the gate spacer such that each of the local contact openings exposes an upper portion of each etch resistant plug.

\* \* \* \* \*